(12) United States Patent
Lin et al.

(10) Patent No.: US 7,161,384 B1
(45) Date of Patent: Jan. 9, 2007

(54) FLEXIBLE MACROCELL INTERCONNECT

(75) Inventors: Guu Lin, San Jose, CA (US);
Stephanie Tran, San Jose, CA (US);
Bruce Pederson, San Jose, CA (US);
Brad Vest, San Jose, CA (US); Jim Park, San Jose, CA (US); Jay Schleicher, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/180,069

(22) Filed: Jul. 12, 2005

Related U.S. Application Data

(62) Division of application No. 10/301,506, filed on Nov. 21, 2002, now Pat. No. 6,927,601.

(51) Int. Cl.
*H03K 19/177* (2006.01)

(52) U.S. Cl. .......................................... 326/41; 326/47
(58) Field of Classification Search .................... 326/38
See application file for complete search history.

(56) References Cited

U.S. PATENT DOCUMENTS

| | | | | |
|---|---|---|---|---|
| 5,869,981 A | * | 2/1999 | Agrawal et al. | ............... 326/39 |
| 5,952,846 A | * | 9/1999 | Silver | ........................... 326/41 |
| 6,084,447 A | * | 7/2000 | Graf, III | ...................... 327/144 |

* cited by examiner

*Primary Examiner*—James H. Cho
(74) *Attorney, Agent, or Firm*—J. Matthew Zigmant; Townsend and Townsend and Crew LLP

(57) ABSTRACT

Methods and apparatus for novel routing structures and methods that improve fitting of user-defined functions onto programmable logic devices. In particular, second time fitting is improved. Exemplary structures and methods include allowing product terms to be expanded using inputs from more than one neighboring macrocell by providing multiple expansion and bypassing paths. Also, product term OR shifting prevents macrocell output stages from being buried and made inaccessible, and macrocell outputs are provided on expander word lines, increasing efficiency of those lines, as well as conserving routing resources. Expansion, bypassing, OR shifting, and expander word lines may terminate at logic array block boundaries or may continue beyond these boundaries to other logic array blocks.

20 Claims, 16 Drawing Sheets

FLEXIBLE MACROCELL INTERCONNECT

This application is a divisional of U.S. patent application Ser. No. 10/301,506, filed Nov. 21, 2002, now U.S. Pat. No. 6,927,601, which is incorporated by reference.

BACKGROUND OF THE INVENTION

The present invention relates to the field of integrated circuits, particularly to programmable logic integrated circuits with macrocells having highly flexible interconnect.

Integrated circuits are important building blocks of the modern age. Technology continues to evolve and integrated circuits continue to provide improved functionality. As integrated circuits improve, so do the electronics systems that are built using integrated circuits. There are many types of integrated circuits such as memories, microprocessors, application specific integrated circuits (ASICs), and veprogrammable logic. Programmable logic integrated circuits such as PALs, PLDs, FPGAs, LCAs, and others, are becoming more complex and continually evolving to provide more user-programmable features on a single integrated circuit.

Modern programmable logic integrated circuits incorporate programmable logic including logic gates, products terms, look-up tables, embedded user-programmable memories, digital signal processing, and microprocessors. These circuits are connected to each other via programmable interconnect lines such that a user-defined logic function is realized. But these programmable interconnect lines and related routing resources consume a large amount of die area. Thus, it is desirable to develop novel structures and methods that make efficient use of a device's programmable interconnect lines.

In order to implement a user-defined function, the specific circuits and programmable interconnect to be used are selected from among those available on the integrated circuit. This process is referred to as "fitting" the design on the programmable logic integrated circuit. A first time fitting routes the user-defined logic function on the integrated circuit. This fitting also determines the integrated circuit's pinout, which may then be used in the design of printed circuit boards.

If the user modifies or adds logic after board design begins, it is desirable to keep the same pinout so that the board layout does not have to be revised. But keeping the pinout fixed, or "locked," reduces the flexibility that the fitter has to make changes needed, that is to do a second time fitting. Often, this means the user has to hand place and route parts of the design, or move to a larger and more expensive device.

Thus, what is needed are novel routing structures and methods that improve first time fitting of user-defined logic functions, as well as allow the fitter more flexibility when doing a second time fitting such that hand placing and routing or moving to a larger device can be avoided.

SUMMARY OF THE INVENTION

Accordingly, embodiments of the present invention provide routing structures and methods that improve fitting of user-defined functions onto programmable logic devices, and in particular allow greater flexibility during a second time fitting.

Embodiments of the present invention provide structures and methods that allow greater routing flexibility. For example, product terms may be expanded by more than one neighboring macrocell by input and bypass paths received from more than one direction. Product-term OR shifting prevents macrocell output stages from being buried and made inaccessible. Macrocell outputs are provided by multiplexers to expander word lines, increasing efficacy of those lines, as well as conserving other programmable interconnect lines. These expander word lines, as well as expansion, bypassing, and OR shifting structures may terminate at logic array block boundaries, or may continue beyond these boundaries to other logic block arrays. Embodiments of the present invention may incorporate one or more of the structures and methods described in this document.

An exemplary embodiment of the present invention provides an integrated circuit having a first macrocell including a first logic circuit configured to generate a first product term and a second macrocell including a second logic circuit configured to generate a second product term. The first and second logic circuits each have an input and an output. A third logic circuit is configured to selectively couple the output of the first logic circuit to the input of the second logic circuit, and a fourth logic circuit is configured to selectively couple the output of the second logic circuit to the input of the first logic circuit.

Another exemplary embodiment of the present invention provides a method of expanding product terms in an integrated circuit including a first macrocell having a first logic circuit and a second macrocell having a second logic circuit. The method includes selectively coupling an output of the first logic circuit in the first macrocell to an input of the second logic circuit in the second macrocell, and selectively coupling an output of the second logic circuit in the second macrocell to an input of the first logic circuit in the first macrocell.

A further exemplary embodiment provides an integrated circuit including a first macrocell having a first programmable register and a first logic circuit configured to generate a first product term and a second macrocell having a second programmable register and a second logic circuit configured to generate a second product term. A third logic circuit is configured to selectively couple an output of the first logic circuit or an output of the second logic circuit to the first programmable register. A fourth logic circuit is configured to selectively couple an output of the second logic circuit or an output of the first logic circuit to the second programmable register.

Yet another exemplary embodiment provides a method of shifting product terms in an integrated circuit including a first macrocell having a first logic circuit and a first programmable register and a second macrocell having a second logic circuit and a second programmable register. The method includes selectively coupling an output of the first logic circuit in the first macrocell or an output of the second logic circuit in the second macrocell to the first programmable register, and selectively coupling an output of the first logic circuit in the first macrocell or an output of the second logic circuit in the second macrocell to the second programmable register.

Yet a further exemplary embodiment of the present invention provides an integrated circuit. This integrated circuit includes a first macrocell having a first logic circuit configured to generate a first product term, a second macrocell having a second logic circuit configured to generate a second product term and displaced in a first direction from the first macrocell, and a third macrocell having a third logic circuit configured to generate a third product term displaced in the first direction from the second macrocell. A fourth logic circuit is configured to selectively couple an output of the third logic circuit or an output of the second logic circuit to an input of the first logic circuit.

Still a further exemplary embodiment of the present invention provides a method of bypassing macrocells in an integrated circuit including a first macrocell having a first logic circuit, a second macrocell having a second logic circuit, and a third macrocell having a third macrocell. The method includes selectively coupling an output of the third logic circuit or an output of the second logic circuit to an input of the first logic circuit.

Another exemplary embodiment of the present invention provides an integrated circuit including a plurality of macrocells arranged in a block, a plurality of programmable interconnect lines selectively coupled to inputs of the plurality of macrocells, and a plurality of logic blocks having inputs coupled to outputs of the plurality of macrocells and outputs selectively coupled to the plurality of programmable interconnect lines.

A better understanding of the nature and advantages of the present invention may be gained with reference to the following detailed description and the accompanying drawings.

DETAILED DESCRIPTION

Figure 1:
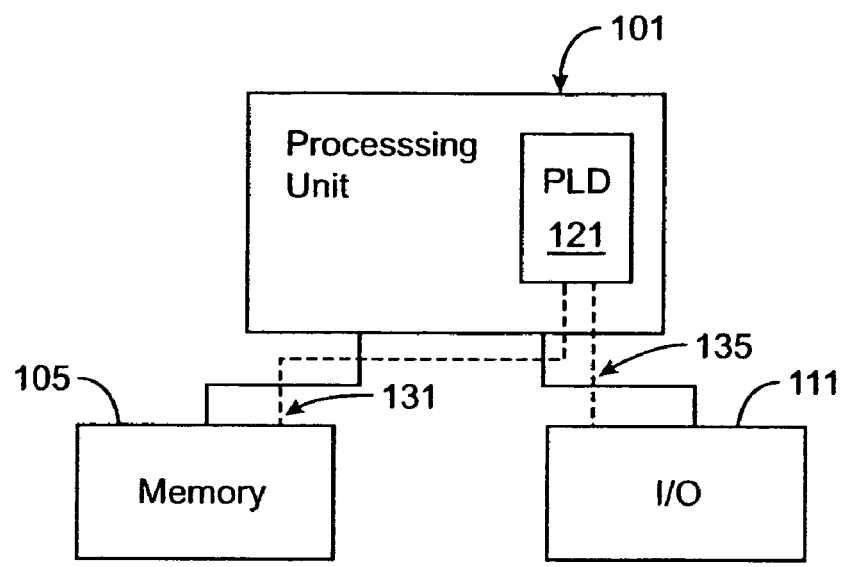
FIG. 1 is diagram of a digital system with a programmable logic integrated circuit.

FIG. 1 shows a block diagram of a digital system, within which the present invention may be embodied. The system may be provided on a single board, on multiple boards, or within multiple enclosures. FIG. 1 illustrates a system 101 in which a programmable logic device 121 may be utilized. Programmable logic devices or programmable logic integrated circuits are sometimes referred to as a PALs, PLAs, FPLAs, PLDs, CPLDs, EPLDs, EEPLDs, LCAs, or FPGAs and are well-known integrated circuits that provide the advantages of fixed integrated circuits with the flexibility of custom integrated circuits. Such devices allow a user to electrically program standard, off-the-shelf logic elements to meet a user's specific needs. Examples of current programmable logic devices are represented by Altera's Classic, MAX®, FLEX®, and APEX™ series of PLDs. These are described in, for example, U.S. Pat. Nos. 4,617,479, 4,871, 930, 5,241,224, 5,258,668, 5,260,610, 5,260,611, 5,436,575, and the *Altera Data Book* (1999). Programmable logic integrated circuits and their operation are well known to those of skill in the art.

In the particular embodiment of FIG. 1, a processing unit 101 is coupled to a memory 105 and an I/O 111, and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, Internet communications and networking, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, network controller, or other processing unit. Furthermore, in many embodiments, there is often no need for a CPU. For example, instead of a CPU, one or more PLDs 121 may control the logical operations of the system. In an embodiment, PLD 121 acts as a reconfigurable processor, which can be reprogrammed as needed to handle a particular computing task. Alternately, programmable logic device 121 may include a processor. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
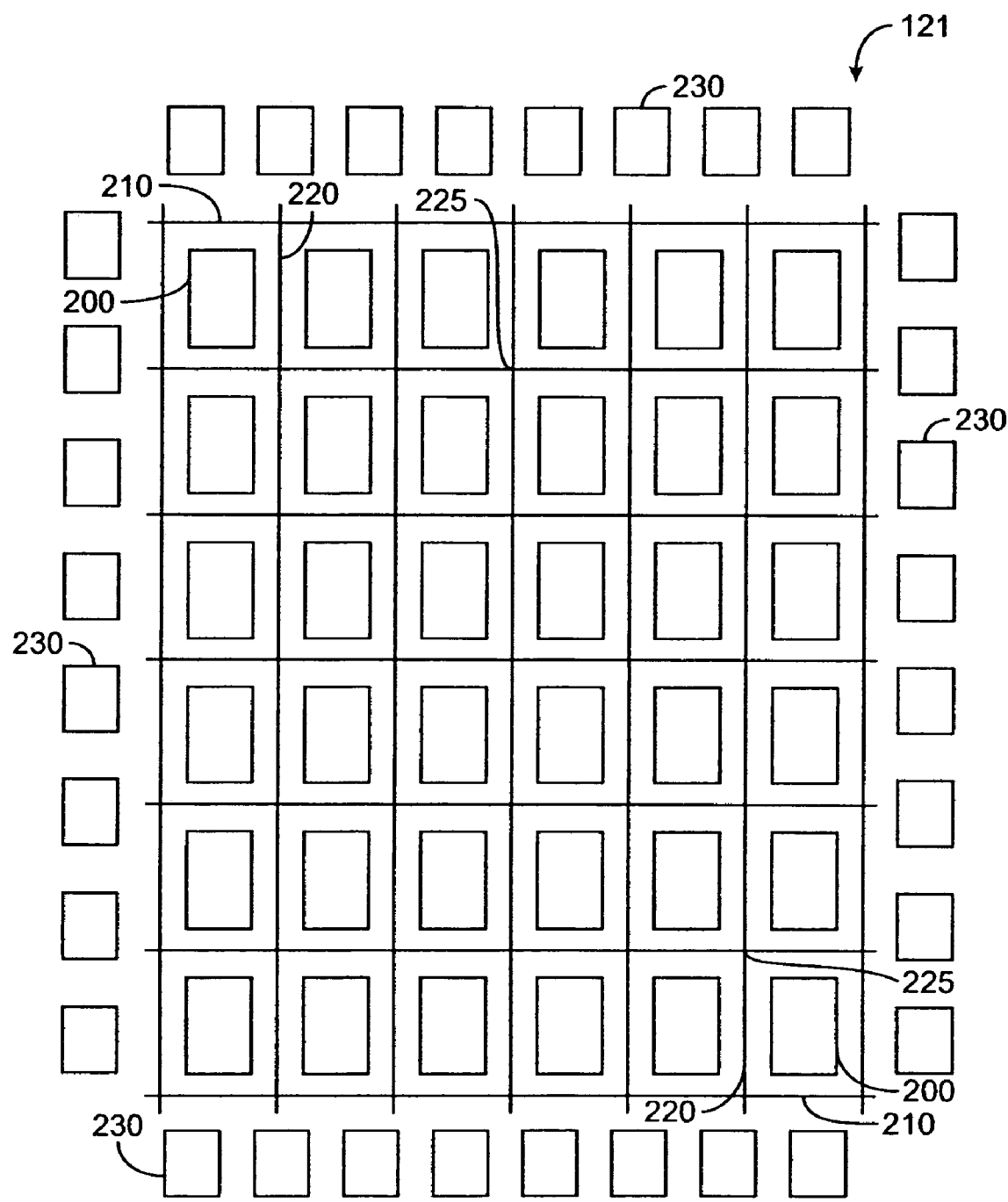
FIG. 2 is a diagram showing a floor plan of a programmable logic integrated circuit with an embedded processor.

FIG. 2 is a simplified block diagram of an overall internal architecture and organization of a PLD. Many details of programmable logic architecture, organization, and circuit design are not necessary for an understanding of the present invention and such details are not shown.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB is described in more detail below. The programmable logic portion may contain any arbitrary number of LABs. Generally, in the future, as technology advances and improves, programmable logic devices with greater numbers of logic array blocks will undoubtedly be created. Furthermore, LABs 200 need not be organized in a square matrix or array; for example, the array may be organized in a five-by-seven or a twenty-by-seventy matrix of LABs. Alternately, there may be two or more rows of LABs divided by one or more columns of interconnect. For example, there may be two columns of LABs, one on each side of a programmable interconnect array.

LAB 200 has inputs and outputs (not shown) which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line may represent a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location of PLD portion 154 to another LAB 200 at another location of PLD portion 154. A signal may pass through a plurality of intersections 225. Furthermore, an output signal from one LAB 200 can be directed into the inputs of one or more LABs 200. Also, using the global interconnect, signals from a LAB 200 can be fed back into the same LAB 200. In specific embodiments of the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

In other embodiments, the programmable logic integrated circuit may include special or segmented interconnect that is connected to a specific number of LABs and not necessarily an entire row or column of LABs. For example, the segmented interconnect may programmably connect two, three, four, five, or more LABs.

Figure 3:
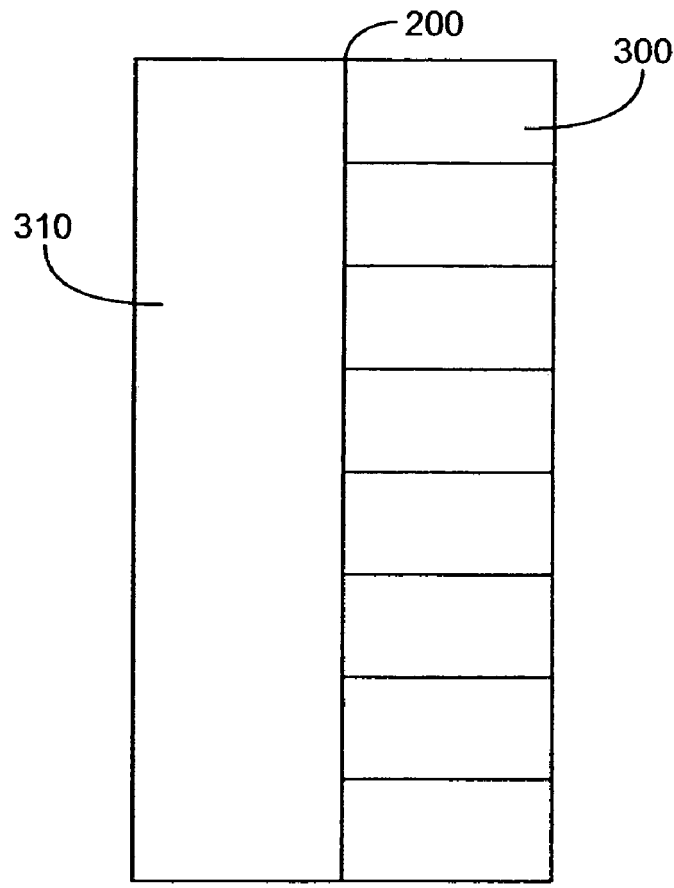
FIG. 3 is a diagram showing the programmable logic portion of the programmable logic integrated circuit.

The programmable logic architecture in FIG. 2 further shows at the peripheries of the chip, input-output drivers 230. Input-output drivers 230 are for interfacing the PLD to external, off-chip circuitry. FIG. 3 shows thirty-two input-output drivers 230; however, a programmable logic integrated circuit may contain any number of input-output drivers, more or less than the number depicted. As discussed above, some of these input-output drivers may be shared between the embedded processor and programmable logic portions. Each input-output driver 230 is configurable for use as an input driver, output driver, or bidirectional driver.

In other embodiments of a programmable logic integrated circuit, the input-output drivers may be embedded with the integrated circuit core itself. This embedded placement of the input-output drivers may be used with flip chip packaging and will minimize the parasitics of routing the signals to input-output drivers.

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight.

A general overview of LE 300 is presented here, sufficient to provide a basic understanding of the present invention. LE 300 is the smallest logical building block of a PLD. Signals external to the LAB, such as from GHs 210 and GVs 220, are programmably connected to LE 300 through local interconnect structure 310. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D or T flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220.

Figure 4:
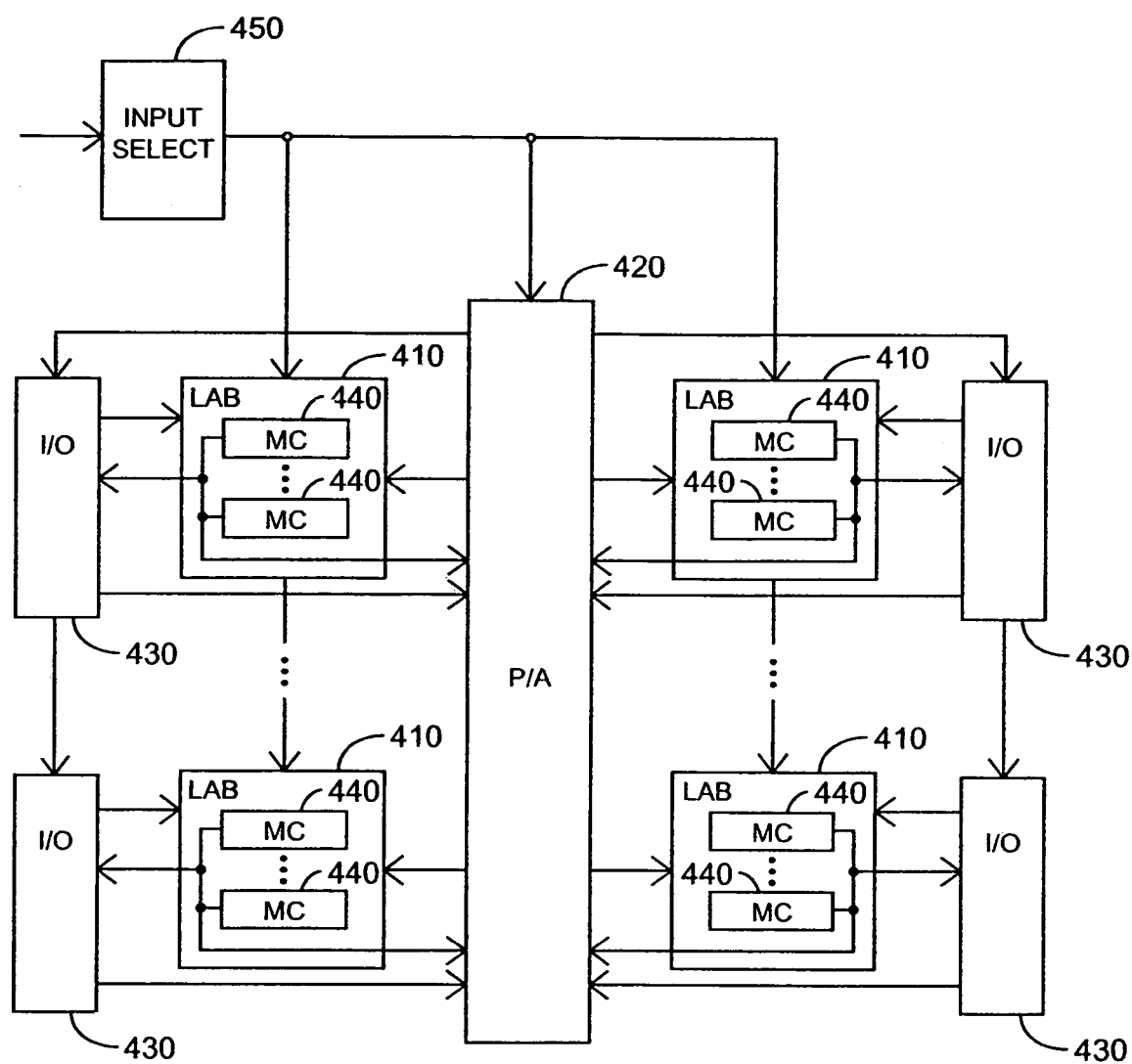
FIG. 4 is a block diagram of an architecture for a programmable logic device that is benefited by inclusion of embodiments of the present invention.

FIG. 4 is a block diagram of an architecture for a programmable logic device that is benefited by inclusion of embodiments of the present invention. Included are logic array blocks 410—each including several macrocells 440—programmable interconnect array 420, input/output blocks 430, and input select circuit 450.

Signal lines such as input and output enables and clock signals are multiplexed by the input select circuit 450 and provided to the logic array blocks 410 and the programmable interconnect array 420. The programmable interconnect array 420 provides routing paths between the logic array blocks 410, and between the logic array blocks 410 and input/output blocks 430. The logic array blocks 410 provide internal routing between macrocells, and provide and receive signals to and from the input/output blocks and programmable interconnect array. The input/output blocks 430 provide and receive signals to and from pads of the integrated circuit, logic array blocks 410, and programmable interconnect array 420.

In one embodiment, there are 16 macrocells in one logic array block. In other embodiments there may be a different number of macrocells in a logic array block. There may be any number of logic array blocks and input/output blocks. For example, there may be anywhere from 2 to 16 logic array blocks, corresponding in the above example to 32 to 256 macrocells. Alternately, there may be more than 16 logic array blocks, and more than 256 macrocells. In other embodiments, there may be other global or local routing paths. Also, one or more of the paths shown here may be omitted.

Figure 5:
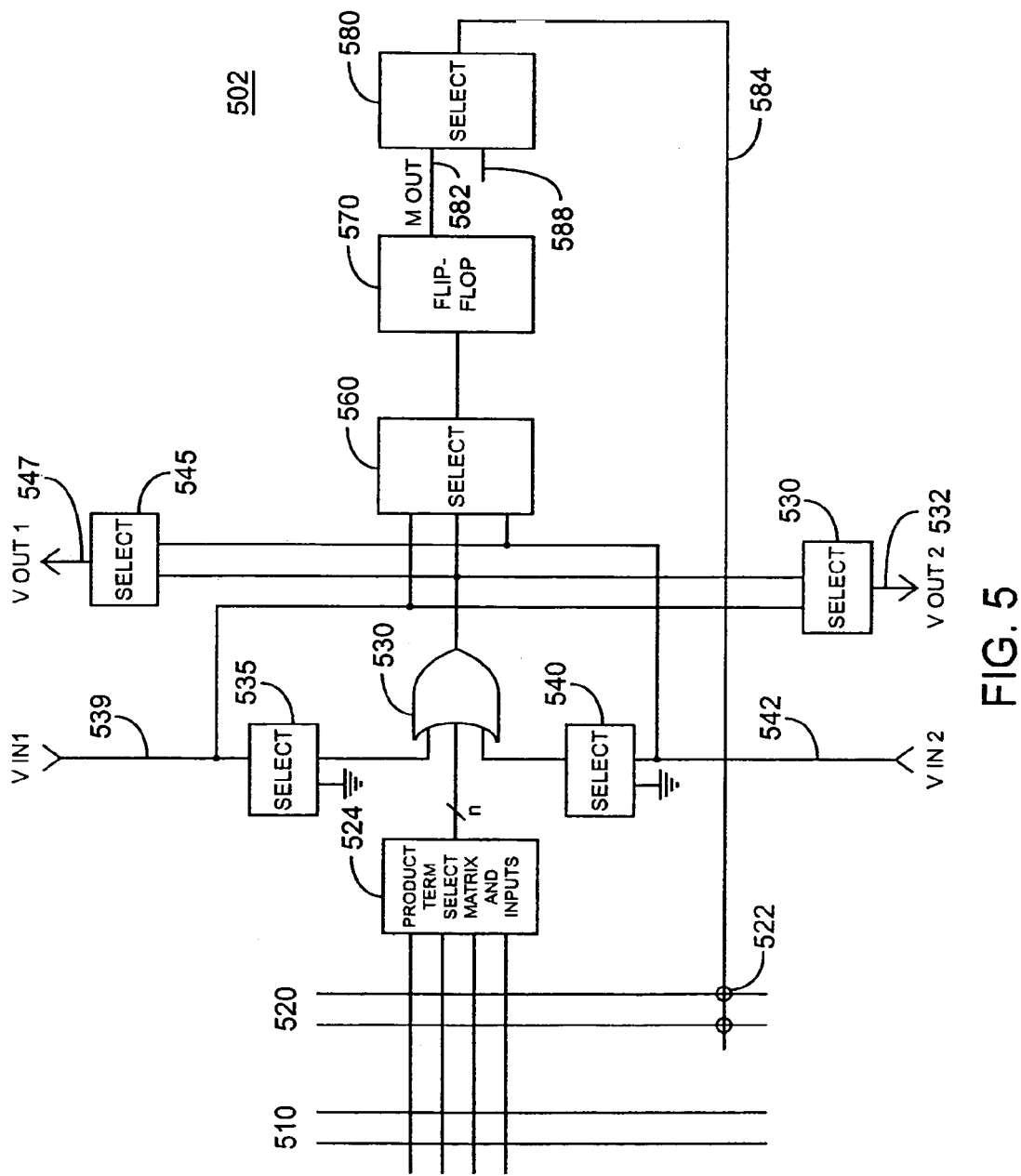
FIG. 5 is a block diagram of a macrocell including several structures and exemplifying methods consistent with embodiments of the present invention.

FIG. 5 is a block diagram of a macrocell 502 including several structures and exemplifying methods consistent with embodiments of the present invention. Various embodiments of the present invention may incorporate some or all of these structures and methods. This block diagram is simplified for clarity. This figure, as with all the included figures, is shown for exemplary purposes only, and does not limit either the possible embodiments of the present invention or the claims.

Included are a product-term select matrix 524, OR gate 530, flip-flop or programmable register 570, and selection circuits 535, 540, 545, 550, 560, and 580. Inputs to the product-term selection matrix 524 may programmably couple to programmable interconnect lines 510 and serial expander word lines 520. Outputs of the product-term select matrix 530 couple to OR gate 530. Or gate 530 may selectively couple to programmable register 570, which provides an output on line 582.

The selection circuits may be multiplexers, pass devices, logic gates, or other structures. The selection circuits 540, 545, 550, 560, and 580 increase the macrocell's configurability. This structure may be repeated in a vertical column such that the signal VIN1 on line 537 couples to a line corresponding to VOUT2 532 in a macrocell above this one. Similarly, the signal VOUT1 on line 547 may couple VIN2 on a line corresponding to line 542.

The selection circuit 535 may expand OR gate 530 by coupling the product-term output from a macrocell above. Similarly selection circuits 540 may be used to expand OR gate 530 by coupling the product-term output from a macrocell below macrocell 502. The input signals VIN2 on line 542 may bypass macrocell 502 through selection circuits 545. Similarly, the input signals VIN1 on line 537 may bypass macrocell 502 through selection circuits 550.

Selection circuits 560 provides OR shifting, where the signal VIN1 on line 537, the signal VIN2 on line 542, or the output of the OR gate 530 may be coupled to the programmable register 570. The programmable register 570 may alternately be another type of storage element, such as a latch or other storage circuit. Various signals, for example the output of this macrocell and other lines, are selectively coupled to local feedback line 584 by selection circuit 580 where they may be selectively coupled to share expander word lines 520 by one or more programmable interconnections 522. These various structures and exemplified methods are further discussed below.

Figure 6:
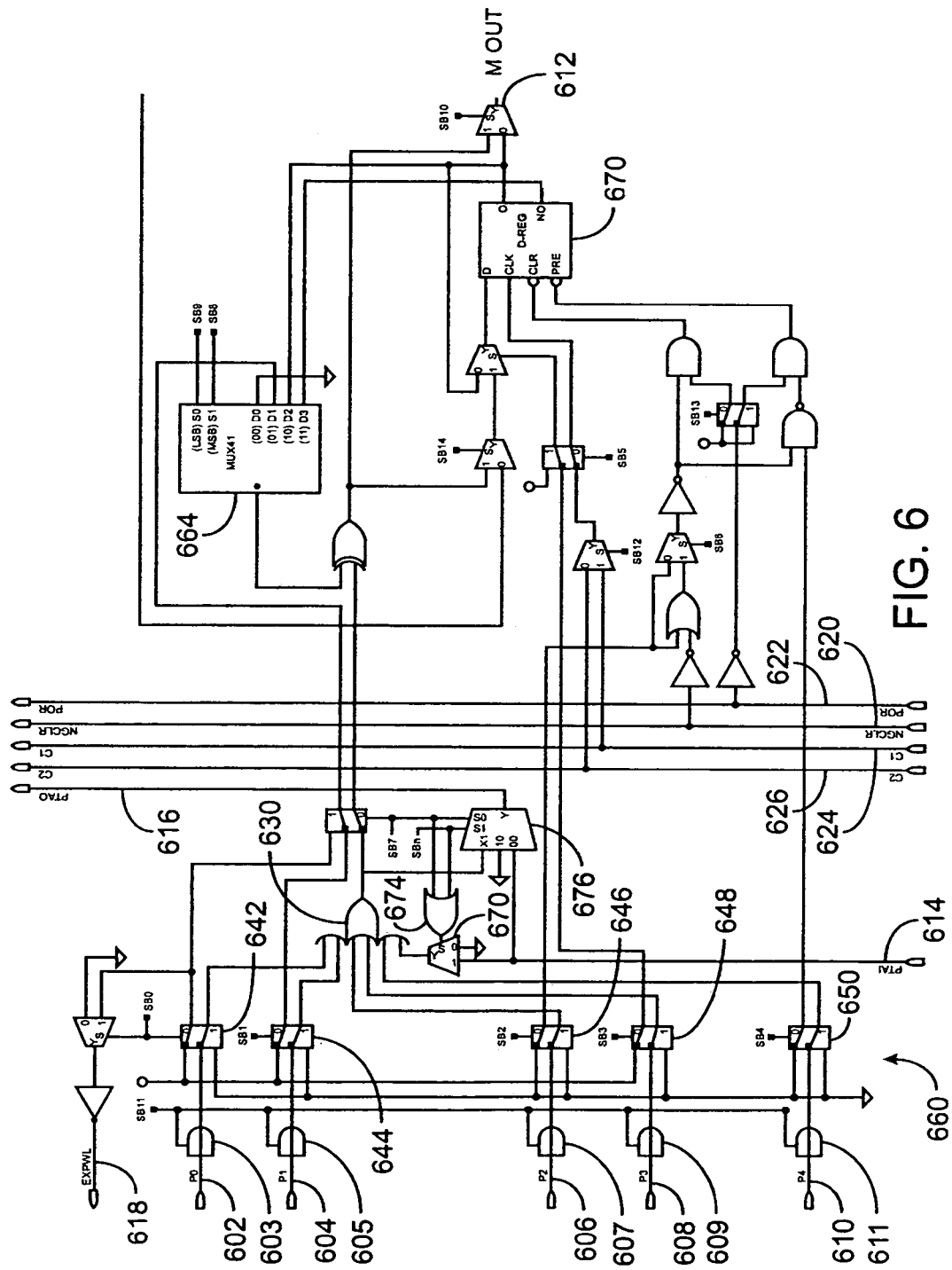
FIG. 6 is a schematic of a macrocell or logic element consistent with an embodiment of the present invention.

FIG. 6 is a simplified schematic of a macrocell or logic element consistent with an embodiment of the present invention. Included are product-term select matrix 660, OR gate 630, and register 670 as major function blocks. Signal inputs and outputs include product-term inputs P0 on line 602, P1 on line 604, P2 on line 606, P3 on line 608, P4 on line 610, macrocell output MOUT on line 612, parallel expander input PTAI on line 614, parallel expander output PTAO on line 616, shared expander word line output signal EXPWL on line 618, power-on-reset signal POR on line 620, and global clear NGCLR on line 622. Input PTAI on line 614 corresponds to an output line PTAO in an adjoining macrocell below the present macrocell. Also included are control signals C1 on line 624 and C2 on line 626. Programmable, or slow bits SB0–SB14 and SBn configure the macrocell. These bits, as with the other programmable bits described in this document, may be stored in EEPROM, Flash, SRAM, DRAM, MRAM, fuse, antifuse, or other structures.

This figure provides a simplified schematic of a specific embodiment of the present invention. Many other embodiments are readily envisioned. For example, a lookup table may replace the product-term select matrix 660 and OR gate 630. The user programmable memory options outlined above may be replaced in high volume production with mask programmable connectors.

Product-term inputs P0 through P4 are received by input gates 603, 605, 607, 609, and 611. When enabled, these gates pass the product-term inputs to the product-term select matrix including multiplexers 642, 644, 646, 648, and 650. Product-term inputs P0 through P4 are directed by the product-term select matrix to OR gate 630 or to another function in the macrocell. For example, product-term input P0 on line 602 may be provided as an input to OR gate 630, inverted and provided as a shared expander output on line 618, or provided as an input to multiplexer 664. If a product-term input is not used as an input to OR gate 630, but it used elsewhere in the macrocell, the corresponding input to OR gate 630 is held low, such that the unused input does not to determine the state of the OR gate output.

If additional OR gate inputs are required to implement a given logic function, the OR gate of another macrocell may be used in combination with OR gate 630, that is OR gate 630 may be expanded. Input signal PTAI on line 614 is the multiplexed output of an OR gate corresponding to OR gate 630 from a macrocell below the present macrocell. If expansion is required, input signal PTAI on line 614 is passed by multiplexer 672 as an input to OR gate 630. If expansion is not required, multiplexer 672 passes ground, or low, to the same input of OR gate 630. Multiplexer 672 is under the control of OR gate 674, the inputs of which are slow bits SB7 and SBn.

In some logic realizations the signal PTAI on line 614 may be needed by a macrocell above the present macrocell. (Note that for simplicity macrocells are referred to as being above or below the present macrocell. They may also be considered to be to the left or right of the present macrocell. Other conventions may alternately be used.) If the input signal PTAI on line 614 is needed by a macrocell above the present macrocell, the present macrocell may be bypassed by using multiplexer 676. In that case, the input signal PTAI on line 614 is passed by the multiplexer 676 as output signal PTAO on line 616. The input signal PTAI on line 614 may also be passed by multiplexer 672 as an input to OR gate 630, or multiplexer 672 may block this signal and provide a logic low at the input of gate 630. As with OR gate 674, multiplexer 676 is under control of slow bits SB7 and SBn. Multiplexer 676 may alternately pass ground or the output of OR gate 630 as output signal PTAO on line 616.

In this way, the signal PTAI on line 614 may be used to expand OR gate 630, or it may bypass this macrocell using multiplexer 676. In an alternate embodiment of the present invention, the signal PTAI on line 614 may both to expand OR gate 630 and bypass the macrocell. By having these options available, the fitter has greater flexibility, particularly in placing and routing logic changes during second time fittings.

Figure 7:
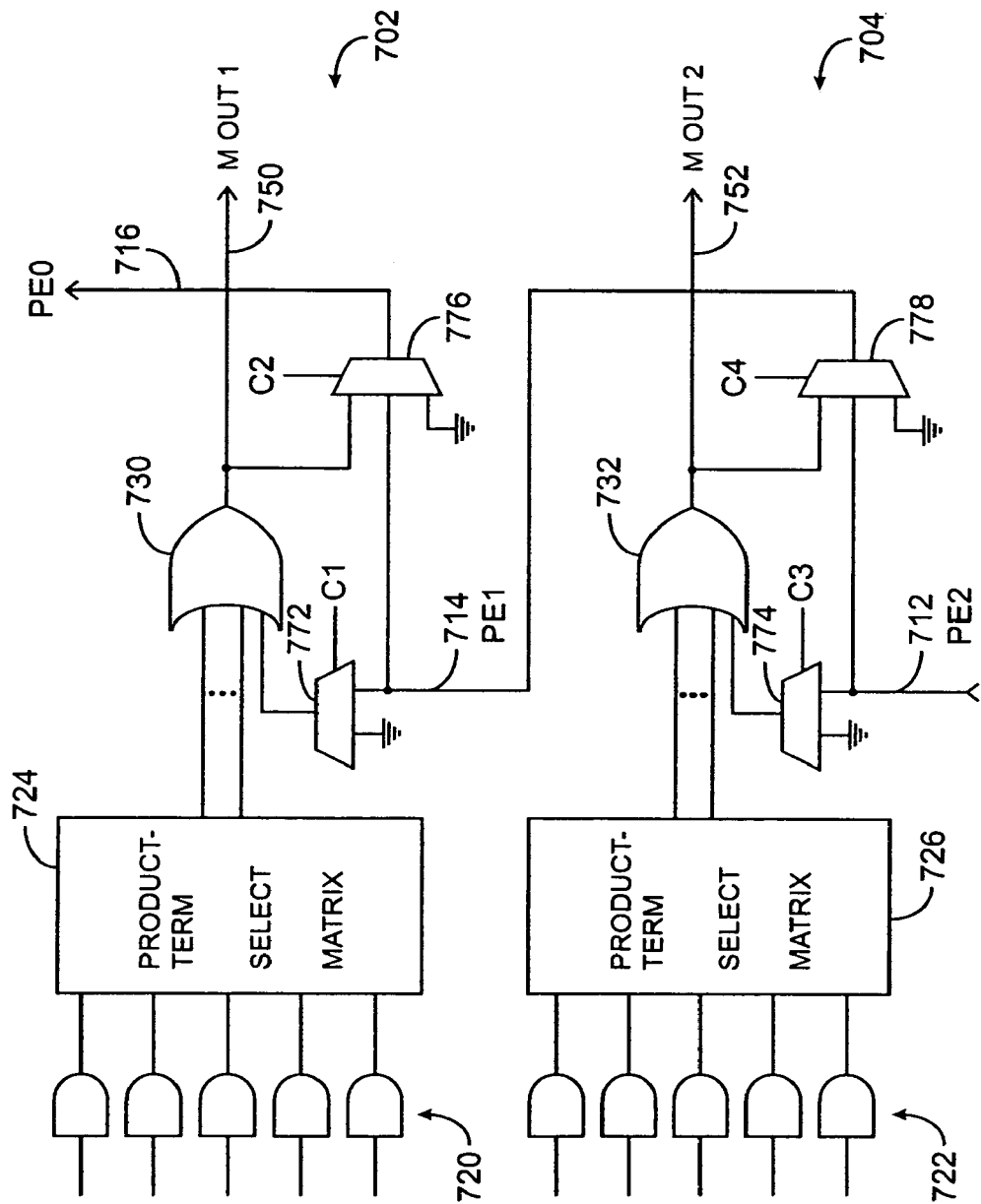
FIG. 7 is a schematic showing bypass structures for bypassing macrocells consistent with an embodiment of the present invention.

FIG. 7 is a schematic showing bypass structures for bypassing macrocells consistent with an embodiment of the present invention. Included are macrocells 702 and 704. These macrocells implement product terms, though other types of macrocells, such as those using lookup tables, may be used. Macrocell 702 includes input gates 720, product-term select matrix 724, OR gate 730, and multiplexers 772 and 776. Macrocell 704 includes input gates 722, product-term select matrix 726, OR gate 732, and multiplexers 774 and 778. Other portions of the macrocells are not included for simplicity. In this specific example, each product-term select matrix receives up to five logic signals via logic gates.

In other embodiments, there may be other numbers of inputs to the product-term select matrix, such as four, less than four, six, or more than six inputs.

If the logic implementation is such that OR gate 730 requires more logical inputs than can be provided by product-term select matrix 724, additional inputs may be received from macrocell 704, one or more macrocells below macrocell 704, or both. In this way, OR gate 730 may be expanded. Additional inputs may be needed for at least two reasons. First, the logic implementation may require more inputs than are available from product-term select matrix 724. Second, even though the logic being implemented may require fewer inputs to OR gate 730 than are available from product-term select matrix 724, some of these inputs may be used for other functions in the macrocell, as was seen in FIG. 6.

If additional inputs are required by OR gate 730, these inputs may be applied to product-term select matrix 726 and macrocell 704. Those inputs are ORed by gate 732 and multiplexed onto line 714 by multiplexer 778 as signal PE1. This signal is in turn multiplexed by multiplexer 772 to the input of OR gate 730 where it is ORed with additional terms from product select matrix 724.

If the logic implementation is such that OR gate 730 requires more logic inputs than can be provided by product-term select matrix 724, and OR gate 732 is not available, for other reasons it is not desirable to use OR gate 732, or more additional inputs are needed than OR gate 732 can provide, additional inputs may be received from one or more macrocells below macrocell 704. Specifically, an OR gate corresponding to OR gates 730 and 732, in a macrocell below 704, has its output multiplexed onto line 712 as signal PE2. This signal is multiplexed by multiplexer 778 onto line 714 as signal PE1, which is multiplexed by multiplexer 772 to an input of OR gate 730. Alternately, signal PE2 on line 712 may be applied to OR gate 732 where it is ORed with signals from product-term select matrix 726, and passed by multiplexers 778 and 772 to OR gate 730. In these ways, the output of a macrocell OR gate may bypass one or more macrocells, or multiple macrocell OR gates may be combined to expand an OR gate in a different macrocell. In other embodiments, other signals may be bypassed from one cell to the next consistent with the present invention.

Figure 8:
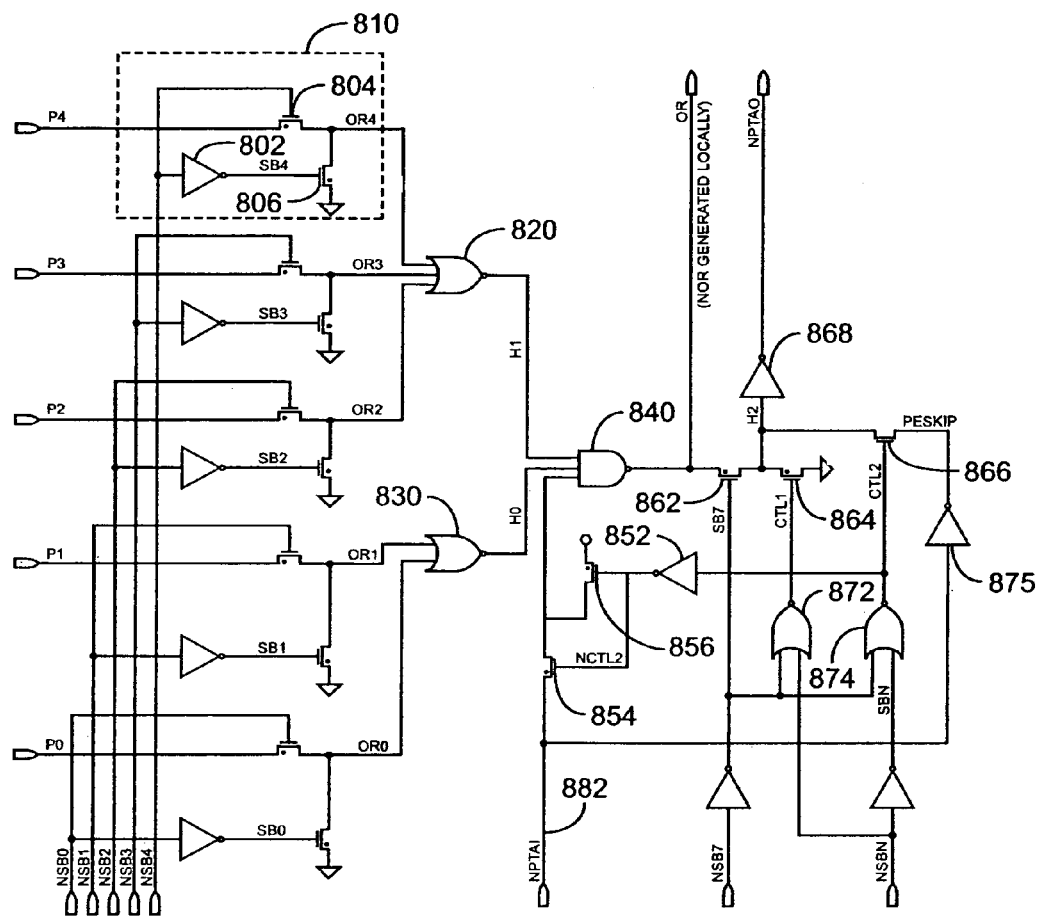
FIG. 8 illustrates an exemplary implementation of some of the circuitry of FIG. 7.

FIG. 8 illustrates an exemplary implementation of some of the circuitry of FIG. 7, such as input gates 720, OR gate 730, and multiplexers 772 and 776 in that figure. Included in this figure are input gates 810, a composite OR gate, and expansion and bypassing logic. Each input gate 810 includes an inverter 802, pass device 804, and pull down 806. When an input gate is enabled, pass device 804 passes the input signal from its input line to a composite OR gate. When the input gate is disabled, the pass device opens (is nonconducting), and pull down device 806 pulls the input of the composite OR gate low such that the disabled input gates that does not determine the output of the composite OR gate. The composite OR gate is formed by NOR gates 820 and 830, and NAND gate 840. One skilled in the art appreciates that this is equivalent to an OR gate, and that other structures may be used.

The function of expander input multiplexer 772 from FIG. 7 is provided by pass transistor 854, pull up device 856, and inverter 852. If the parallel expander input NPTAI on line 882 is to be used by this macrocell, it is passed by pass gate 854. If the parallel expander input is not to be used, pass transistor 854 opens, and pull-up device 856 pulls the input of NAND gate 840 to VCC such that the unused input line does not determine the output of the composite OR gate and metastabilities are avoided.

If the output of the composite OR gate is to be used to expand a neighboring macrocell, pass transistor 862 is enabled. The function of macrocell bypass multiplexer 776 in FIG. 7 is provided by pass transistors 862 and 866, pull-down device 864, NOR gates 872 and 874, and inverter 875. Parallel expander input signal NPTAI on line 882 may bypass the macrocell entirely when pass device 866 is enabled. Alternately, if NPTAI is not provided to the next macrocell, pull down device 864 is active such that the input state of inverter 868 is determined, such that metastabilities are avoided. NOR gates 872 and 874 are arranged to ensure that only one device drives inverter 868 when SB7 is low or pass transistor 862 is off. In other embodiments, input NPTAI may expand the composite OR gate and be provided as output NPTAO simultaneously.

Figure 9:
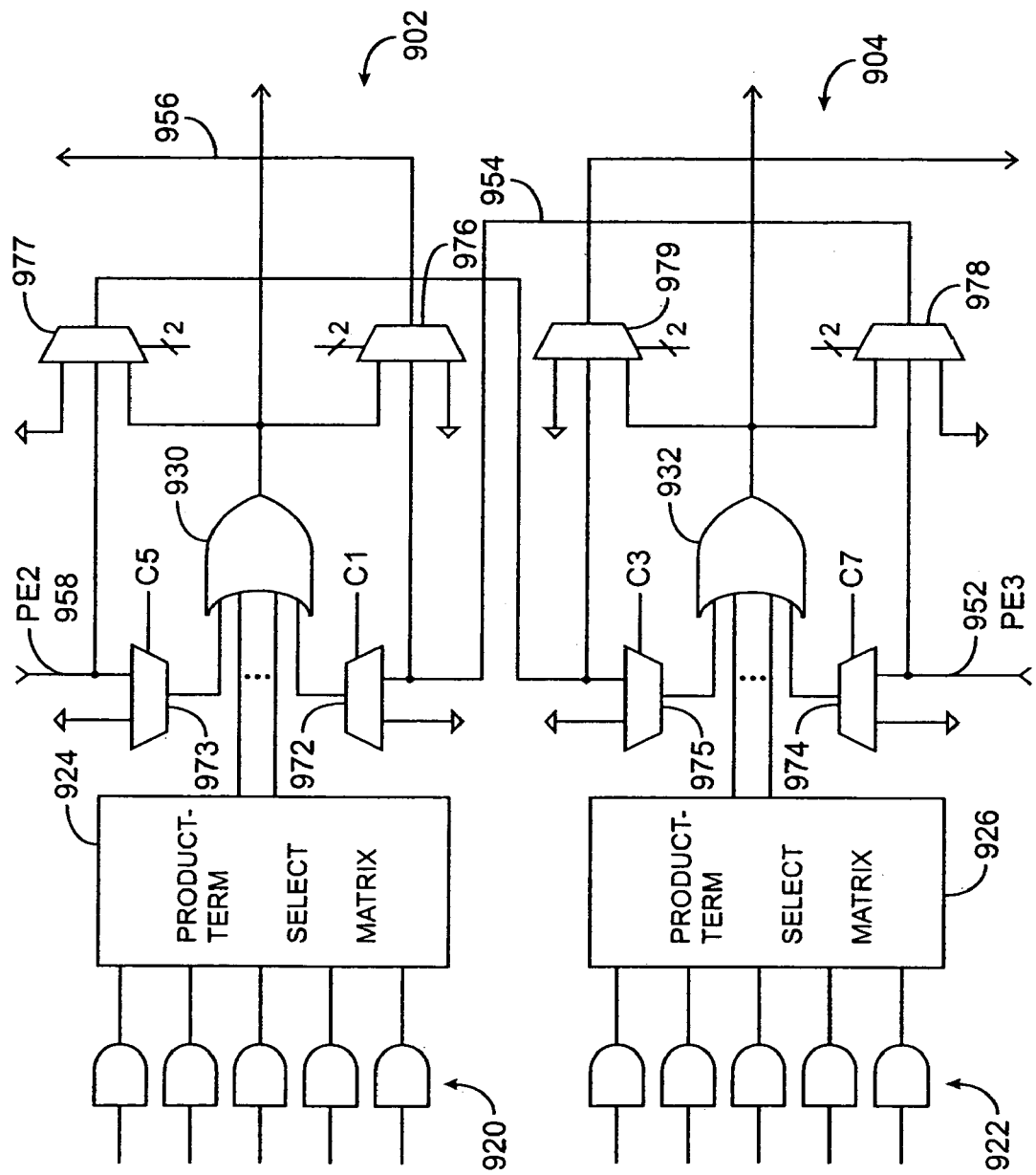
FIG. 9 shows bypass and parallel expander circuitry which send and receive signals from more than one macrocell.

FIG. 9 shows two simplified macrocells having bypass and parallel expander circuitry that sends signals to, and receives signals from more than one neighboring macrocell in more than one direction. Included are a first macrocell 902 having input gates 920, product-term select matrix 924, OR gate 930, expander multiplexers 972 and 973, bypass multiplexers 976 and 977, and a second macrocell 904 having input gates 922, product-term select matrix 926, OR gate 932, parallel expander multiplexers 974 and 975, and bypass multiplexers 978 and 979.

With this configuration, OR gate 930 may be expanded using product terms from macrocells above or below it. For example, the output of OR gate 932 may be multiplexed onto line 954 by multiplexer 978 and provided as an input to OR gate 930 by multiplexer 972. Alternately, or in combination, multiplexer 973 may direct signal PE2 on line 958 to the input of OR gate 930. Also, an output from a first OR gate may be used to expand a second OR gate, the output of which is used to expand yet another gate, and so on. In this way, one, two, three or more OR gates may be used to expand a macrocell OR gate.

Also, the expander signals PE2 and PE3 may bypass one or more macrocells. For example, parallel expander input PE3 on line 952 may bypass macrocell 904 and be provided on line 954 by multiplexer 978. This signal on line 954 maybe provided as an expander input to OR gate 930 by multiplexer 972, it may bypass macrocell 902 via multiplexer 976, and in some embodiments it may do both.

In a specific embodiment, the top macrocell in a logic array block receives expansion and bypass signals from the neighboring macrocell below it, the bottom macrocell receives expansion and bypass signals from the neighboring macrocell above it, and intermediate macrocells receive expansion and bypass signals from neighboring macrocells above and below. In various embodiments, the ability to expand and bypass in multiple directions may be realized separately or combination. Also, the ability to expand or bypass may be in one, two, three, or more directions, such as four directions, and the number of directions from which a gate may be expanded does not have to equal the number of directions from which a macrocell may be bypassed.

Figure 10:
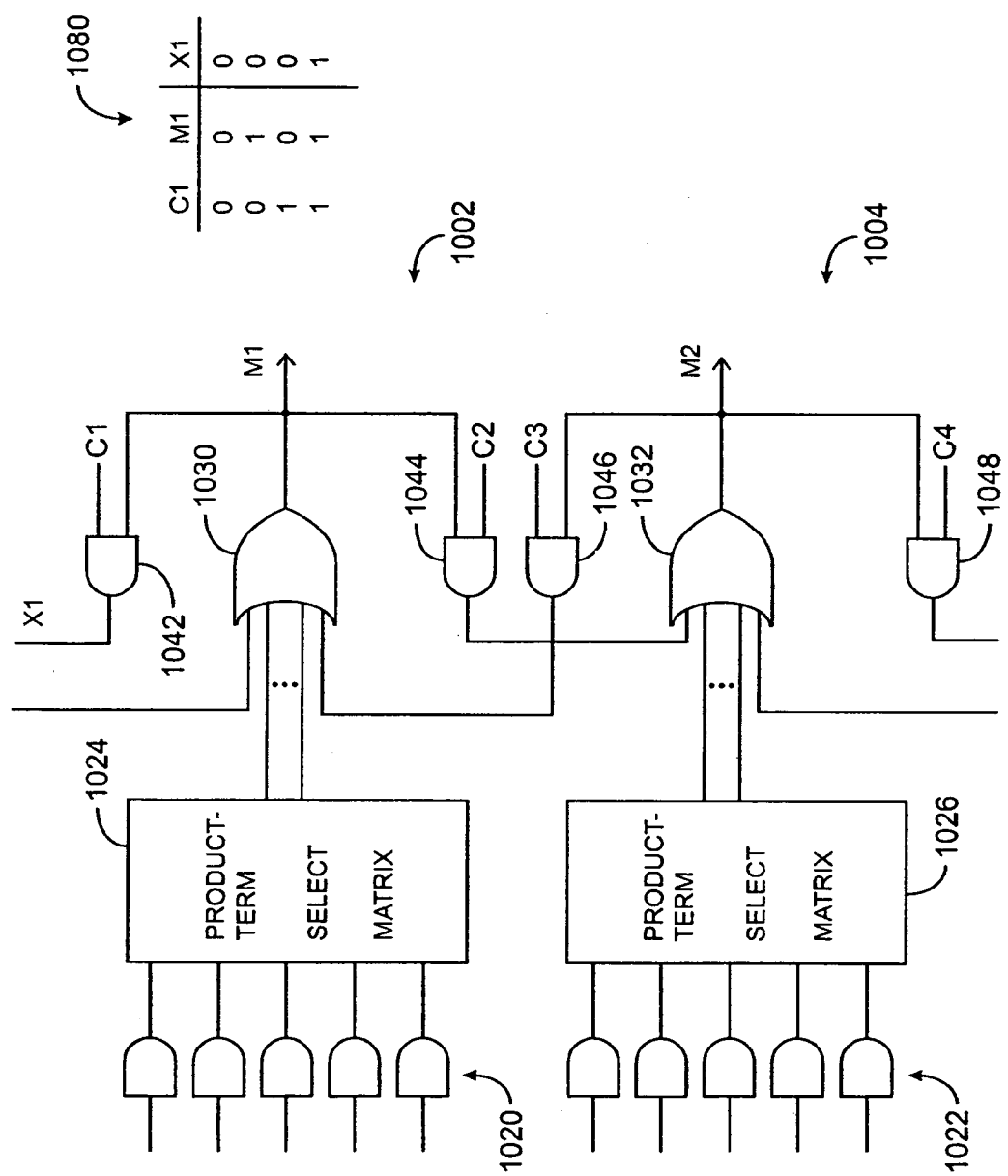
FIG. 10 shows two macrocells having circuitry which enables the parallel expansion of a macrocell from more than one neighboring macrocell.

FIG. 10, for example, is a simplified schematic showing two macrocell portions 1002 and 1004 having circuitry which enables the parallel expansion of each macrocell from multiple directions. Included are a first macrocell 1002 having input gates 1020, product-term select matrix 1024, OR gate 1030, and AND gates 1042 and 1044, and a second macrocell 1004 having input gate 1022, product-term select matrix 1026, OR gate 1032, and AND gates 1046 and 1048.

The AND gates 1042, 1044, 1046, and 1048 provided paths for the parallel expansion of the OR gates in the macrocells. Alternately, multiplexers may provide this function. Specifically, AND gate 1042 provides a path where OR gate 1032 may be expanded by including the output of OR gate 1030. Also, AND gate 1046 provides a path where OR gate 1030 may be expanded by including the output of OR gate 1032. AND gates 1042 and 1048 allowed expansion of OR gates in macrocells above 1002 and below 1004, respectively.

The AND gates act as multiplexers under control of logic signals C1, C2, C3, and C4. For example, truth table 1080 shows X1, the output signal of AND gate 1042, as a function of M1, the output of OR gate 1030, and control line C1. When C1 is low, X1 is low. When C1 is high, X1 follows the state of M1.

When an OR gate in a macrocell is used to expand an OR gate in another macrocell, the remainder of the macrocell, for example flip-flopped 670 in FIG. 6, may not be fully utilized. Thus, second time fitting can be improved by including circuitry consistent with an embodiment of the present invention with provides the ability to shift the output of an OR gate from one cell to another.

Figure 11:
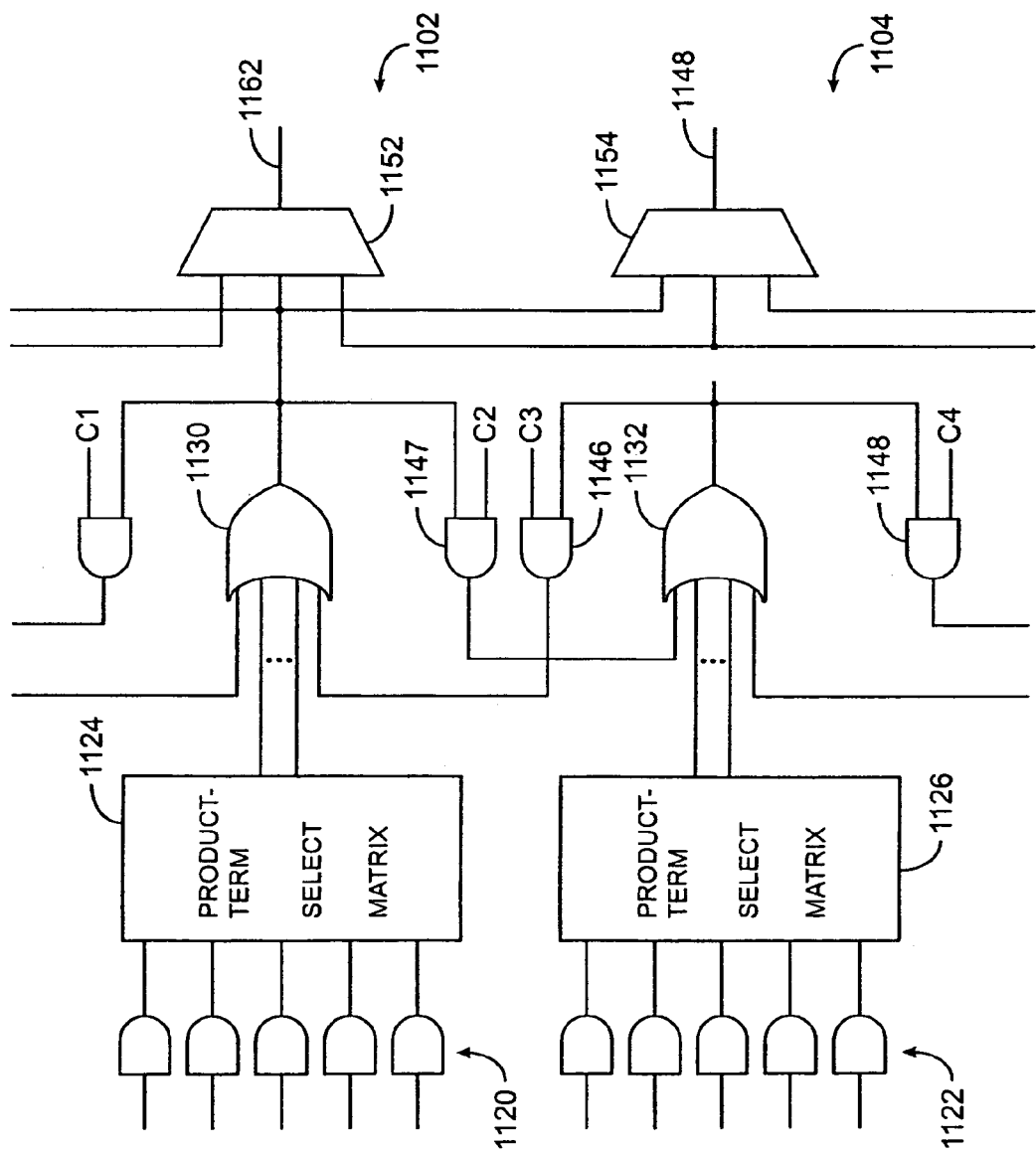
FIG. 11 illustrates two macrocells including circuitry implementing OR shifting and parallel expanding from more than one neighboring macrocell.

FIG. 11 illustrates two macrocell portions including circuitry implementing OR shifting and parallel expanding in two directions. Included are a first macrocell having input gates 1120, product-term select matrix 1124, OR gate 1130, AND gates 1142 and 1144, multiplexer 1152, a second macrocell having input gates 1122, product-term select matrix 1126, OR gate 1132, AND gates 1146 and 1148, and multiplexer 1154. The outputs of multiplexers 1152 and 1154 are provided on lines 1162 and 1164 to the remaining portions of the macrocell which are not shown.

As before, AND gates, such as 1142, 1144, 1146, and 1148, provide paths by which OR gates such as 1130 and 1132 can expand other OR gates. But here the OR gates can be used not only to expand OR gates in other macrocells, but may be shifted and used as inputs to the remaining portions of adjoining macrocells. Specifically, the output of OR gate 1130 in macrocell 1120 may be multiplexed as an output to the remaining portion of its own macrocell, macrocell 1104, the macrocell above macrocell 1102 or any combination thereof. That is, the input line 1162 to the remaining portion of macrocell 1102 may receive inputs from macrocell OR gate 1130 in macrocell 1102, OR gate 1132 in macrocell 1104, or a corresponding OR gate in the macrocell above macrocell 1102.

In a specific embodiment, as in this example, OR gates can be shifted by one macrocell in two directions. In other embodiments, an OR gate may be shifted in more than one direction, or by one or more macrocells.

Figure 12:
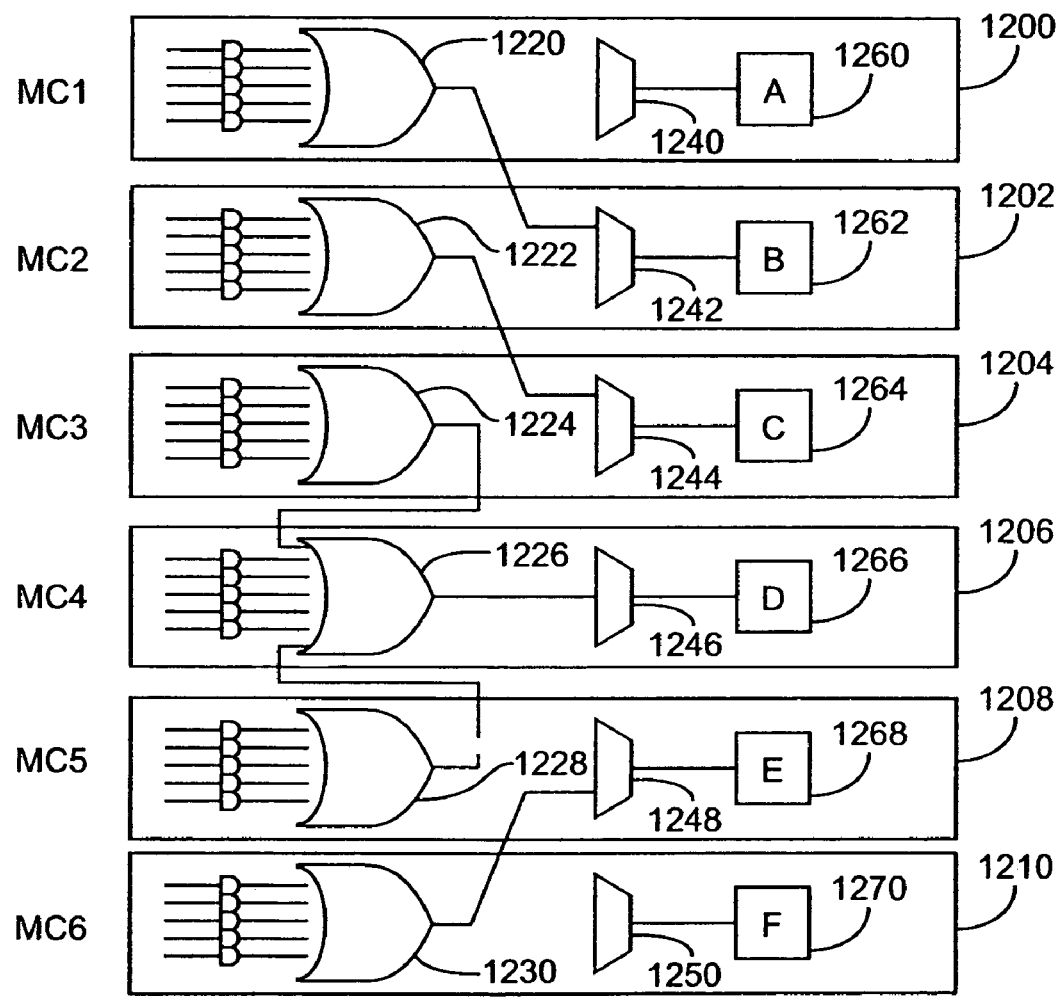
FIG. 12 shows six macrocells incorporating the above parallel expander and OR shifting concepts.

FIG. 12 shows six macrocells incorporating the above parallel expander and OR shifting concepts. Included are six macrocells, labeled MC1 through MC6, each macrocell including an OR gate, multiplexer, and remaining macrocell portion labeled A through F. Parallel expander multiplexers and unused routing lines are not shown for simplicity.

In this example, MC4 1206 requires a product term of 15 inputs. Accordingly, OR gates 1224 and 1228 in the third and fifth macrocells are used to expand OR gate 1226 in the fourth macrocell. The remaining portions in the third and fifth macrocells are utilized by OR shifting the outputs of OR gates 1222 and 1230 through multiplexers 1244 and 1248 to remaining portions C 1264 and E 1268. As can be seen, in this specific example, unused macrocell portions are available in the first and sixth macrocells for easy access by other circuitry. Alternately, the OR gate 1226 in MC4 1206 could be expanded to 15 inputs by providing the output of OR gate 1222 in MC 2 as an input to OR gate 1224 in MC3, and providing the output of OR gate 1224 as an input to OR gate 1126. This "daisy chaining" can be used to expand OR gates in one or more directions, though additional gate delays are incurred.

Figure 13:
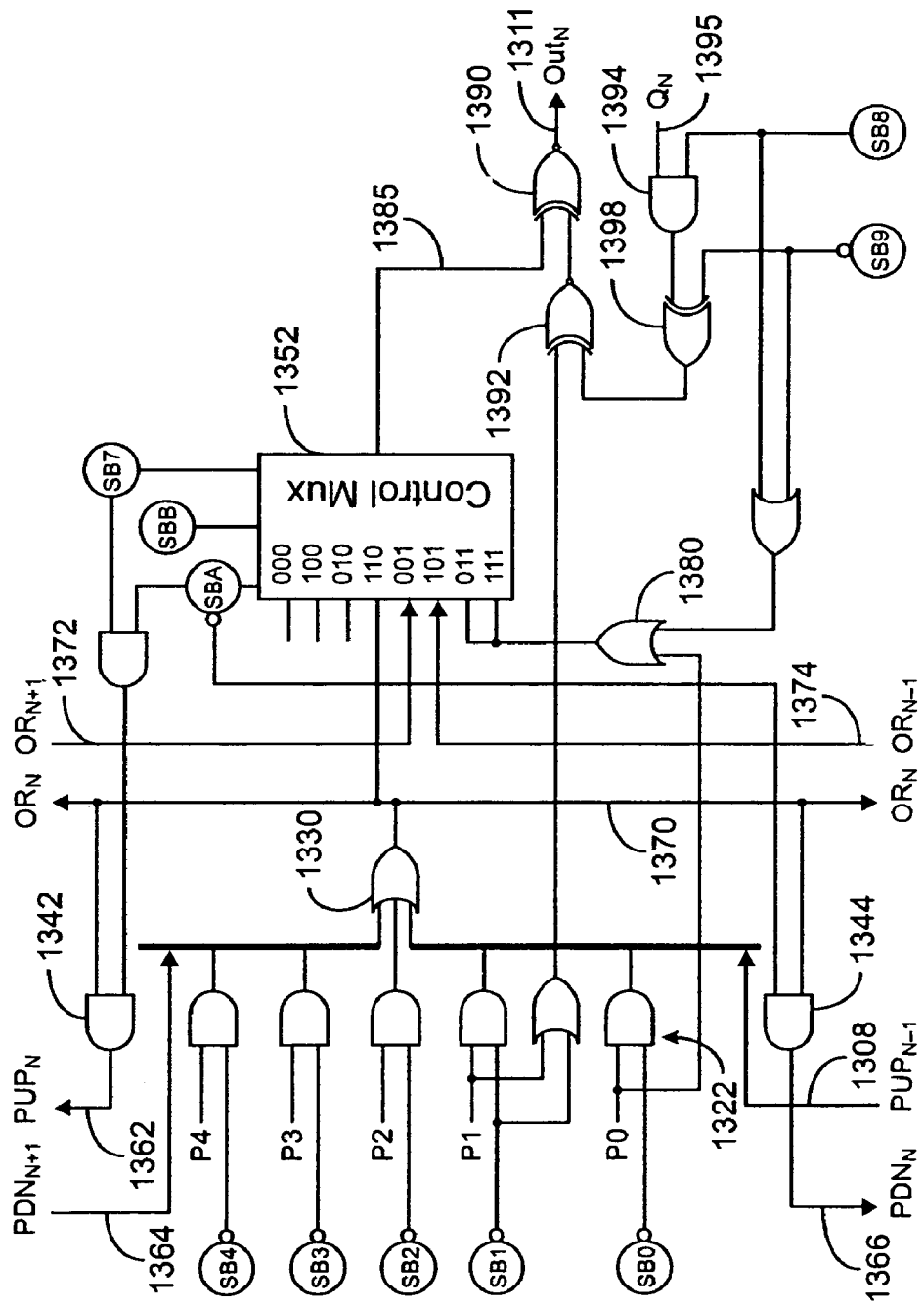
FIG. 13 is an example of a specific implementation of a macrocell portion including circuitry for parallel expanding and OR shifting between macrocells.

FIG. 13 is an example of a specific implementation of a macrocell portion including circuitry for parallel expanding OR and shifting between macrocells. Included are input gate 1322, AND gates 1342 and 1344, OR gate 1330, and control multiplexer 1352.

OR gate 1330 may be expanded using parallel expander signals on lines 1364 or 1368. The output of OR gate 1330 may be used as a parallel expander input to other OR gates via lines 1362 and 1366, using AND gates 1342 and 1344. The output of OR gate 1330 is provided to neighboring cells on line 1370. The multiplexer 1352 selects the output of OR gate 1330, or the output of corresponding OR gates in other macrocells using lines 1372 and 1374. The control multiplexer is controlled by slow bits SBA, SBB, and SB7. In this specific example, multiplexer 1352 may also select the output of OR gate 1380. The output of control multiplexer 1352 is provided on line 1385 to XOR gate 1390.

Also included is a highly flexible circuit that can be configured to implement a variety of logic functions. Specifically, XOR gates 1390, 1392, and 1398, and 1394 couple to a register, such as register 670 in FIG. 6. In one embodiment, the output of XOR gate 1390, OUTn on line 1391, connects to the D input of a register, while the Q output of the register on line 1395 connects to an input of AND gate 1394. By configuring the programmable bits SB0, SB9, and SB8, the register can be configured as a D-type, inverting D-type, T-type, or inverting T-type register. Also, depending on the state of XOR gate 1392, XOR gate 1390 either passes or inverts the signal on line 1385 from control multiplexer 1352. In this way, this circuit can selectively provide an inverted or noninverted output, and either a D-type or T-type flip-flop.

Figure 14:
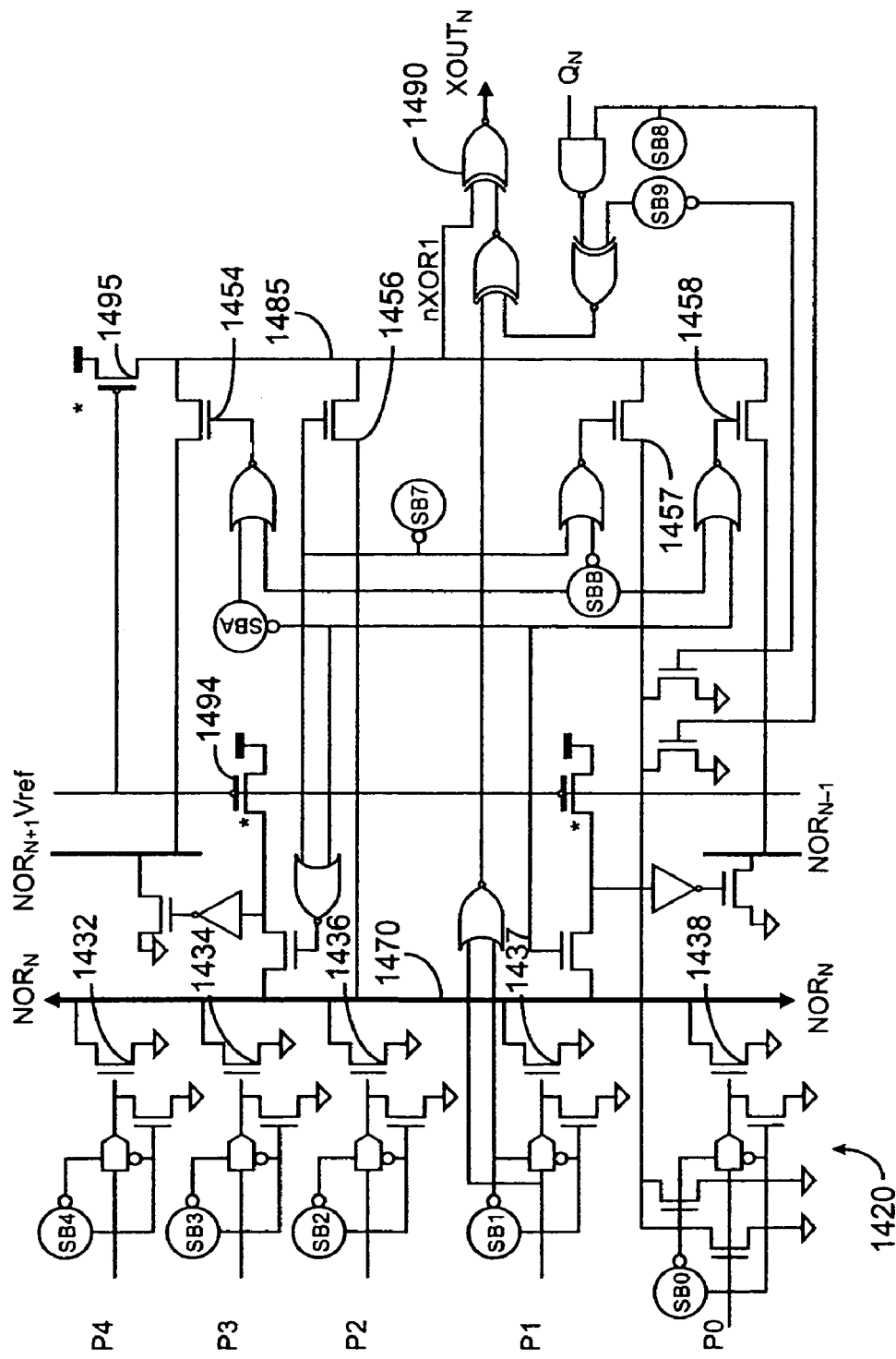
FIG. 14 illustrates a specific circuit implementation of a macrocell portion consistent with an embodiment of the present invention.

FIG. 14 illustrates a specific implementation of circuitry in a macrocell consistent with an embodiment of the present invention. Included are input gates 1420, an OR gate made up of several NOR-tied devices, and a multiplexer formed by the parallel combination of several pass transistors.

In this specific example, the OR function is implemented by NOR-tied pull-down devices 1432, 1434, 1436, 1437, and 1438. If any enabled product-term input is high, its corresponding pull-down device is active, thus pulling line 1470 to ground. If no enabled product-term inputs is low, NOR output line 1470 remains high. NOR output line 1470 may be pulled high by a pull up current source device.

The multiplexer function is provided by pass transistors 1454, 1456, 1457, and 1458. When pass transistor 1454 is active, the output of a NOR gate from an above macrocell is routed to the multiplexer output on line 1485. When pass transistor 1456 is active, the output of the NOR gate in this macrocell is routed to the output line, when pass transistor 1458 is active, the output of a NOR gate from a below macrocell is routed to the output line, and when pass transistor 1457 is active, product-term input P0 is provided to the output line. The output line 1485 of the multiplexer is provided to the input of XOR gate 1490 current source 1295 provides a pull-up for this line. Parallel expander capabilities are not included in this specific implementation.

Figure 15:
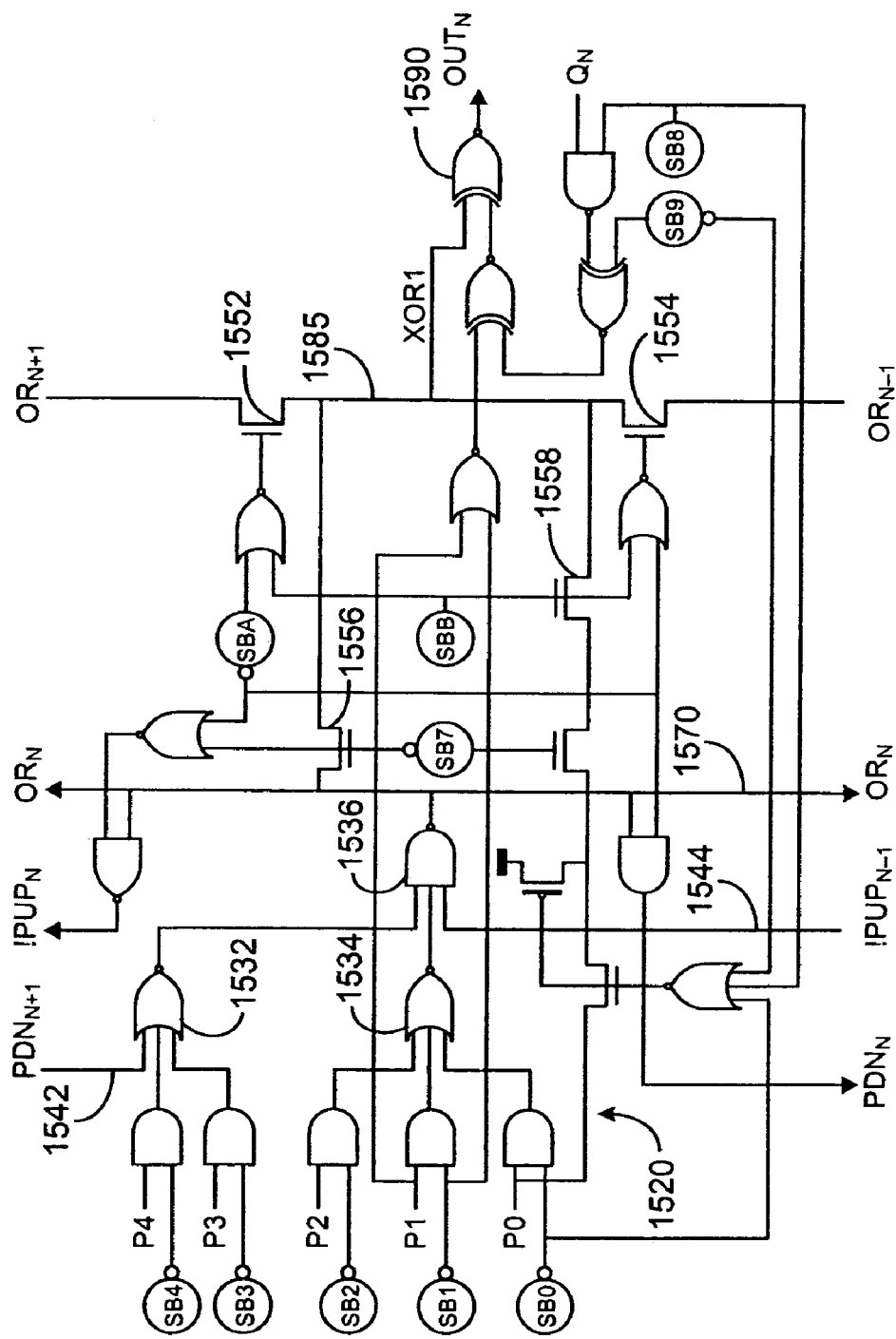
FIG. 15 is a further specific circuit implementation of a portion of a macrocell consistent with the present invention.

FIG. 15 is a further specific embodiment of a portion of a macrocell consistent with the present invention. In this implementation, both parallel expansion and OR shifting in two directions is supported. Included are input gates 1520, an OR gate formed by a composite of NOR gates 1532 and 1534 and NAND gate 1536, a multiplexer formed by the combination of several pass transistors, and XOR gate 1590.

Again, the composite of NOR gates 1532 and 1534 and NAND gate 1536 form an OR function. This OR function may be expanded by signals on lines 1542 and 1544. When pass transistor 1552 is active, the output of a composite OR gate in the above macrocell is passed to multiplexer output line 1585 to the XOR gate 1590. When pass transistor 1556 is active, the output of the composite OR gate in this macrocell is passed to the output line. When pass transistor 1554 is active, the output of an OR gate in the below macrocell is directed to the output line 1585 of the multiplexer. When pass transistor 1558 is active product-term input P0 is provided at the output line 1585.

In some programmable logic devices, it is difficult to route the output of a macrocell to inputs of other macrocells in the same logic array block. For example, to accomplish this in a programmable logic device having the architecture shown in FIG. 4 a macrocell's output is routed through a vertical global line to a horizontal global line, through a local interconnect, and back into the macrocell's logic array block. This circuitous routing adds delay to the signal path and consumes valuable routing resources.

Figure 16:
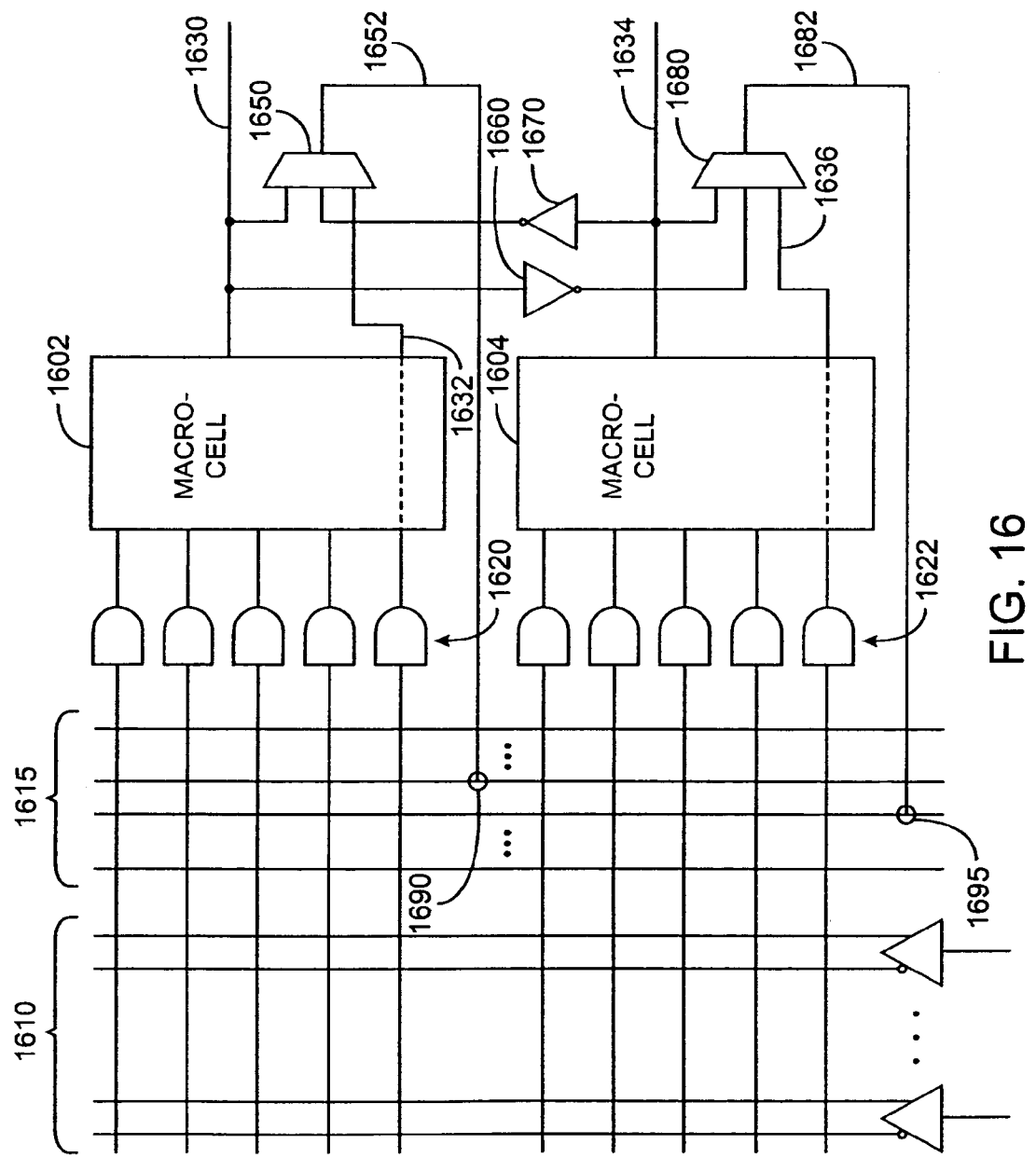
FIG. 16 illustrates the use of expander word lines to make better use of existing routing structures in a manner consistent with the present invention.

FIG. 16 is a schematic of a portion of a logic array block that simplifies this routing in a manner consistent with the present invention. Included are local interconnect lines 1610, expander word lines (programmable interconnect lines) 1615, macrocells 1602 and 1604, multiplexers 1650 and 1680, inverters 1616 and 1670, and switches 1690 and 1695. Macrocell input gates 1620 and 1622 are shown separately for reasons of clarity. In this example, multiplexers 1650 and 1680 provided p-terms directly from the output of a macrocell to serial expander word lines where they are selectable as product-term inputs by other macrocells in the logic array block.

Specifically, multiplexer 1650 selects among the output of macrocell 1602, the inverted output of macrocell 1604, or a product term provided by the macrocell on line 1632. The output of multiplexer 1650 is applied on line 1652 where it is selectable by switch 1690 on from expander word line 1615. Similarly, the output of multiplexer 1680 selects among the output of macrocell 1604, the inverted output of macrocell 1602, or a product term provided by macrocell 1604 on line 1636. The output of multiplexer 1680 is provided on line 1682, where it is selectable by switch 1695 from expander word 1615. In this way, both a true and complementary output of each macrocell, as well as a product-term input, may be provided as a product-term input to other macrocells in its logic array block without the need for consuming valuable route paths outside the logic array block.

One skilled in the art will appreciate that other configurations besides this specific example may be made consistent with embodiments of the present invention. For example, each multiplexer may receive noninverted outputs from neighboring macrocells, inverted outputs from their own macrocells, inputs from more than one neighboring macrocell, or other signals from their own or neighboring macrocells. Whatever the configuration, the re-use of serial expander word lines to provide local feedback capability can improve first time fitting and increase flexibility of the interconnect structure for second time fittings.

The above functions of bypassing, parallel expanding, OR shifting, and serial expanding, may stop at logic array block boundaries. Alternately, these functions may continue beyond logic array block boundaries and bridge different logic array blocks. For example, adjacent logic arrays blocks or a series of logic arrays blocks may be bridged.

Figure 17:
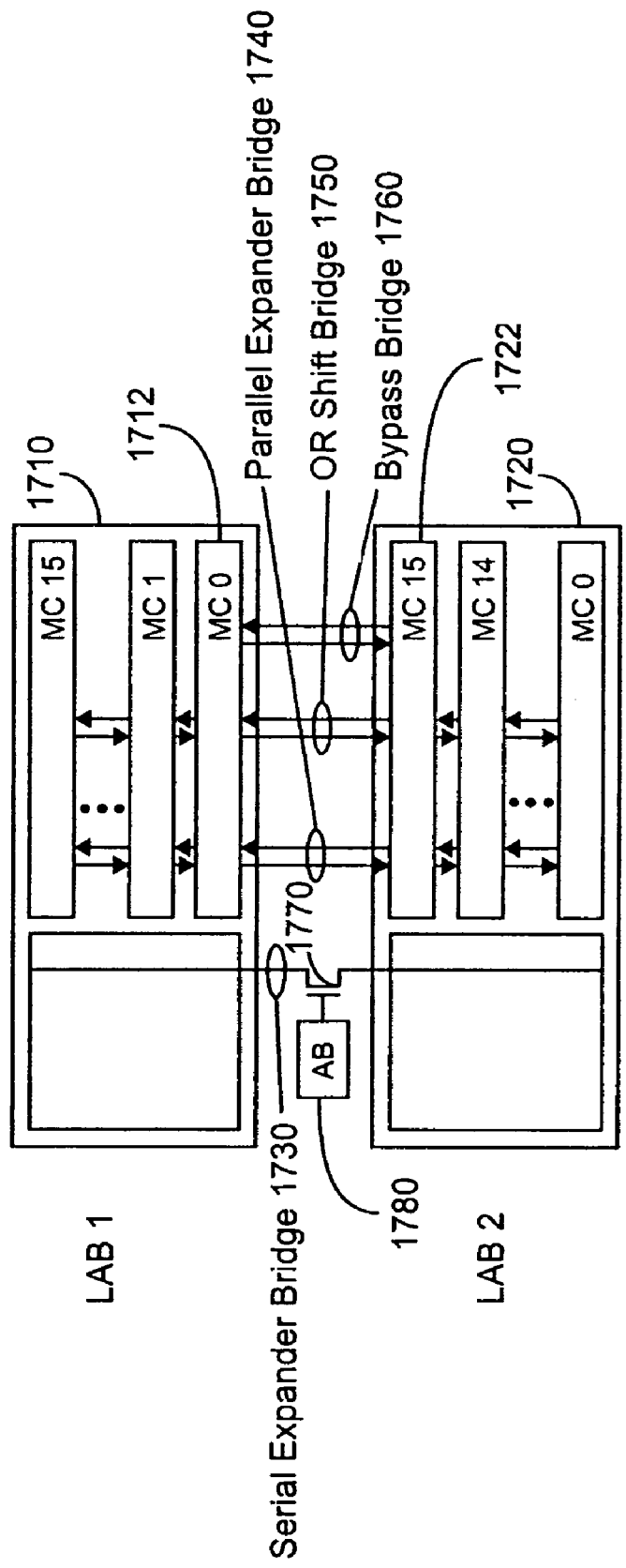
FIG. 17 shows alternate structures provided by embodiments of the present invention for routing signals between two logic array blocks.

FIG. 17 shows how these functions may be used to route signals between two logic array blocks. In this specific example, the logic array blocks are neighboring, aligned one above the other. Other arrangements are contemplated by embodiments of the present invention. Included are a first logic array block 1710, second logic array block 1720, shared expander bridge 1730, pass transistor 1770, programmable cell 1780, parallel expander bridge 1740, OR shift bridge 1750, and bypass bridge 1760.

Some or all the expander word lines in logic array block 1710 may be selectively connected to some or all of the expander word lines in logic array block 1720. For each serial expander word line that can be connected, a pass gate 1770, under control of a programmable bit in a programmable cell 1780, may be active, thus connecting an expander word line in logic array block 1710 to an expander word line in logic array block 1720.

Interconnect for parallel expansion between logic array blocks may be provided in at least one or two directions. For example, interconnect may be provided such that circuitry in macrocell MC0 1712 may be used to expand the product-term input in macrocell MC5 1722. Also, interconnect may be provided such that macrocell MC5 1722 maybe used to expand macrocell MC0 1712. Similarly, OR shifting may be provided by bridge lines 1740, and bypassing may be provided by bridge lines 1760 in at least one or two directions between macrocells MC0 1712 and MC5 1722.

The foregoing description of specific embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. An integrated circuit comprising:
   a first macrocell having a first true output and a first complementary output;
   a second macrocell having a second true output and a second complementary output;
   a first logic circuit to selectively couple the first true output of the first macrocell or the second complementary output of the second macrocell to an output of the first logic circuit; and
   a first programmable interconnect line for selectively coupling the output of the first logic circuit to an input of the first macrocell and an input of the second macrocell.

2. The integrated circuit of claim 1 further comprising:
   a second logic circuit to selectively couple the second true output of the second macrocell or the first complementary output of the first macrocell to an output of the second logic circuit; and
   a second programmable interconnect line for selectively coupling the output of the second logic circuit to an input of the first macrocell and an input of the second macrocell.

3. The integrated circuit of claim 2 wherein the first and second logic circuits are multiplexers.

4. The integrated circuit of claim 2 wherein the first logic circuit further selectively couples a first signal provided by the first macrocell to the output of the first logic circuit, and the second logic circuit further selectively couples a second signal provided by the second macrocell to the output of the second logic circuit.

5. The integrated circuit of claim 4 wherein the first and second logic circuits are multiplexers.

6. The integrated circuit of claim 5 wherein the first and second macrocells each comprise a look-up table.

7. The integrated circuit of claim 5 wherein the first and second signals are product terms.

8. The integrated circuit of claim 7 wherein the first and second macrocells each comprise a product-term select matrix.

9. The integrated circuit of claim 1 wherein the first logic circuit further selectively couples a first signal provided by the first macrocell to the output of the first logic circuit.

10. A method of routing signals in an integrated circuit comprising a first macrocell and a second macrocell, the method comprising:
selectively coupling a first true output of the first macrocell or a first complementary output of the second macrocell to a first programmable interconnect line; and
selectively coupling the first programmable interconnect line to an input of the first macrocell and an input of the second macrocell.

11. The method of claim 10 further comprising:
selectively coupling a second true output of the second macrocell or a second complementary output of the first macrocell to a second programmable interconnect line; and
selectively coupling the second programmable interconnect line to an input of the first macrocell and an input of the second macrocell.

12. The method of claim 11 wherein the first and second macrocells each comprise a look-up table.

13. The method of claim 11 wherein the first and second macrocells each comprise a product-term select matrix.

14. An integrated circuit comprising:
a first macrocell;
a second macrocell;
a first selection circuit having a first input coupled to a first output of the first macrocell and a second input coupled to a first output of the second macrocell;
a second selection circuit having a first input coupled to a second output of the first macrocell and a second input coupled to a second output of the second macrocell;
a first programmable interconnect line for selectively coupling an output of the first selection circuit to an input of the first macrocell and an input of the second macrocell; and
a second programmable interconnect line for selectively coupling an output of the second selection circuit to an input of the first macrocell and an input of the second macrocell.

15. The integrated circuit of claim 14 wherein the first selection circuit further has a third input coupled to receive a first signal provided by the first macrocell, and the second selection circuit further has a third input coupled to receive a second signal provided by the second macrocell.

16. The integrated circuit of claim 15 wherein the first and second signals are product terms.

17. The integrated circuit of claim 14 wherein the first and second logic circuits are multiplexers.

18. The integrated circuit of claim 14 wherein the first and second macrocells each comprise a look-up table.

19. The integrated circuit of claim 14 wherein the first and second macrocells each comprise a product-term select matrix.

20. The integrated circuit of claim 14 wherein the integrated circuit is a field programmable gate array.

* * * * *

UNITED STATES PATENT AND TRADEMARK OFFICE
CERTIFICATE OF CORRECTION

PATENT NO. : 7,161,384 B1
APPLICATION NO. : 11/180069
DATED : January 9, 2007
INVENTOR(S) : Guu Lin et al.

It is certified that error appears in the above-identified patent and that said Letters Patent is hereby corrected as shown below:

On the title page, Item "[75] Inventors", change "Pederson" to --Pedersen--

Signed and Sealed this

Twenty-ninth Day of July, 2008

JON W. DUDAS
*Director of the United States Patent and Trademark Office*